United States Patent [19]
Saito et al.

[11] Patent Number: 5,990,541
[45] Date of Patent: Nov. 23, 1999

[54] SEMICONDUCTOR DEVICE AND METHOD OF FABRICATING THE SAME

[75] Inventors: Satoshi Saito; Toyohiro Harazono, both of Fukuyama, Japan

[73] Assignee: Sharp Kabushiki Kaisha, Osaka, Japan

[21] Appl. No.: 08/432,521

[22] Filed: May 1, 1995

[30] Foreign Application Priority Data

Jun. 6, 1994 [JP] Japan .................................. 6-124011

[51] Int. Cl.[6] .................................................. H01L 23/58
[52] U.S. Cl. ........................ 257/635; 257/637; 257/640
[58] Field of Search ................................... 257/641, 752, 257/640, 649, 411, 635, 637

[56] References Cited

U.S. PATENT DOCUMENTS

| | | | |
|---|---|---|---|
| 5,055,427 | 10/1991 | Haskell | 438/634 |
| 5,258,645 | 11/1993 | Sato | 257/411 |
| 5,285,102 | 2/1994 | Ying | 257/637 |
| 5,424,570 | 6/1995 | Sardella et al. | 257/641 |
| 5,598,028 | 1/1997 | Losavio et al. | 257/641 |

FOREIGN PATENT DOCUMENTS

| | | |
|---|---|---|
| 63-207168 | 8/1988 | Japan . |
| 2-209753 | 8/1990 | Japan . |
| 5-41459 | 2/1993 | Japan . |

*Primary Examiner*—Mark V. Prenty
*Attorney, Agent, or Firm*—Nixon & Vanderhye P.C.

[57] ABSTRACT

A semiconductor device comprising: a silicon nitride film formed on a semiconductor substrate having a first wiring layer; a first silicon oxide film formed on said silicon nitride film; and a second silicon oxide film formed on said first silicon oxide film by way of an atmospheric pressure CVD process using tetraethyl orthosilicate, siloxane, or disilazane as a source material.

9 Claims, 8 Drawing Sheets

| Under-layer | Angle of tilt | |
|---|---|---|
| | $\ell$=1 μm | $\ell$=2 μm |
| SiO2/SiN | 10° | 26° |
| SiN | 14° | 32° |

Sample

Wiring thickness: 0.7 μm, TEOS/O3-NSG Film thickness 1.3 μm.
SiN : 500Å,  SiO2 : 1000Å

|  | Relative life |
|---|---|
| SiN=500 Å+TEOS | 0.1 |
| SiN=1000 Å+TEOS | 0.8 |
| SiN=0 Å+SOG=5000Å | 0.04 |

Relative life = $\dfrac{\text{Hot carrier life after formation of interlayer insulating film}}{\text{Hot carrier life after first layer wiring}}$ Hot carrier life means a time required for 10% deterioration of β of transistor

Fig.8

SEMICONDUCTOR DEVICE AND METHOD OF FABRICATING THE SAME

BACKGROUND OF THE INVENTION

1. Field of the Invention

The present invention relates to a semiconductor device and a method of fabricating the same. More particularly, the invention relates to a semiconductor device having a microstructure and a multi-layer wiring structure, and a method of fabricating the same.

2. Related Art

Multi-layer wiring structure is needed, since semiconductor devices are more highly integrated and the density of wiring lines for interconnecting elements increases. This requires an interlayer insulating film between first and second wiring layers to be made flat to prevent the disconnection of wiring lines on steps of the elements and first wiring layer. Conventionally, organic or inorganic silicon oxide coating films have been used as a flattening material, resulting in the generation of particles and cracks and the deterioration of transistor characteristics due to moisture diffusion in the film.

In recent years, a film (hereinafter referred to as "TEOS/$O_3$—$SiO_2$ film") formed by way of the atmospheric pressure chemical vapor deposition (CVD) process employing $O_3$/tetraethyl orthosilicate (TEOS) as a source material has been attracting a great deal of attention as an interlayer film for LSIs having the micropatterns, since the TEOS/$O_3$—$SiO_2$ can be formed at a low temperature below 400° C. and has a selfflattening property that allows a step coverage to have a flowing shape in deposition.

The deposition rate of the TEOS/$O_3$—$SiO_2$ film, however, is highly underlayer-dependent, which differs depending on materials and shapes of the underlying layer. The deposition rate is high when the underlayer is silicon and is low when the underlayer is an insulating film such as $SiO_2$ film. Further, the deposition rate also differs depending on the flow ratio of $O_3$ to TEOS.

In general, films deposited under a condition of high $O_3$/TEOS flow ratio have a higher crack-resistance, a lower moisture content in the film, and a better step coverage than those deposited under a condition of low $O_3$/TEOS flow ratio and provide an excellent film quality, but are disadvantageous in that they depend heavily on the underlayer. The TEOS/$O_3$—$SiO_2$ film, which contains moisture, presents the problems of low reliability resulting from hot carriers and corrosion of wiring lines when used in MOS devices.

To solve the problems, Japanese Unexamined Patent Publication No. 2(1990)-209753 discloses an interlayer film of three-layer construction consisting of a plasma $SiO_2$ film, a TEOS/$O_3$—$SiO_2$ film and a plasma $SiO_2$ film. A manufacturing process of the interlayer film is illustrated in FIGS. 6(a) to 6(c).

First, an interlayer insulating film 4 is formed over a semiconductor substrate 1 on which a gate oxide film 2 and a gate electrode 3 are formed. A first wiring layer 5 is formed on the interlayer insulating film 4, and a first silicon oxide film 7 (plasma $SiO_2$ film) is formed so as to cover the interlayer insulating film 4 and the first wiring layer 5. Then, a TEOS/$O_3$—$SiO_2$ film 8 is formed over the first silicon oxide film 7 (see FIG. 6(a)).

In turn, the TEOS/$O_3$—$SiO_2$ film 8 is etched back to form a second silicon oxide film 10. A third silicon oxide film 11 (plasma $SiO_2$ film) is formed over the second silicon oxide film 10 (see FIG. 6(b)).

The first silicon oxide film, the second silicon oxide film and the third silicon oxide film formed above the first wiring layer are subjected to an etching process to form a connecting hole therethrough. A second wiring layer is formed in the connecting hole by way of a photoresist process. Thus, a semiconductor device is fabricated (see FIG. 6(c)).

It is thought that the first silicon oxide film 7 and third silicon oxide film 11 (plasma $SiO_2$ films) act as a barrier layer against organic substances produced when the TEOS/$O_3$—$SiO_2$ film 8 is formed, and also serve to alleviate the underlayer-dependence of the TEOS/$O_3$—$SiO_2$ film 8 when the first silicon oxide film 7 is 2000 Å to 3000 Å thick.

Japanese Unexamined Patent Publication No. 5(1993)-41459 discloses a two-layer structure consisting of a silicon nitride film formed by way of the low pressure CVD process or plasma CVD process and the TEOS/$O_3$—$SiO_2$ film formed on the silicon nitride film to improve the step coverage configuration.

Japanese Unexamined Patent Publication No. 63(1988)-207168, which does not employ the TEOS/$O_3$—$SiO_2$ film, discloses a three-layer structure consisting of a plasma SiN film of 200 Å in thickness, a CVD $SiO_2$ film, and an SOG (spin on glass) film to prevent moisture penetration through the plasma SiN film.

The above discussed prior art techniques present the following.

(1) Japanese Unexamined Patent Publication No. 2-209753

Where the $O_3$/TEOS flow ratio is low (=1), it will be understood from FIG. 2(a) that the deposition rate of the TEOS/$O_3$—$SiO_2$ film on an Si wafer is generally equal to that on a flat portion (at the point A in FIG. 4) with a metal pattern, but the deposition rate of the TEOS/$O_3$—$SiO_2$ film is not satisfactory. In FIG. 2(a), the open circles represent the deposition rate of the TEOS/$O_3$—$SiO_2$ film on the Si wafer, and the solid circles represent the deposition rate of the TEOS/$O_3$—$SiO_2$ film on the flat portion (at the point A in FIG. 4) with the metal pattern. The triangles of FIG. 2(a) represent the deposition rate on the flat portion with a metal pattern in accordance with the present invention.

Where the $O_3$/TEOS flow ratio is high (=7) for formation of a TEOS/$O_3$—$SiO_2$ film of excellent quality, it will be understood from FIG. 2(b) that the deposition rate greatly differs between the TEOS/$O_3$—$SiO_2$ film on the Si wafer and the TEOS/$O_3$—$SiO_2$ film on the flat portion (at the point A in FIG. 4) with the metal pattern, failing to provide the flatness. In FIG. 2(b), the open circles represent the deposition rate of the TEOS/$O_3$—$SiO_2$ film on the Si wafer, and the solid circles represent the deposition rate of the TEOS/$O_3$—$SiO_2$ film on the flat portion (at the point A in FIG. 4) with the metal pattern. The low deposition rate of the TEOS/$O_3$—$SiO_2$ film on the flat portion leads to decreased throughput. Further, variations in film thickness within the wafer surface cause the TEOS/$O_3$—$SiO_2$ film to have different thicknesses around the point A on the wafer as shown in FIGS. 5 and 5(a), resulting in variations in thickness of the interlayer insulating film. In FIG. 5, the open circles represent the film thickness distribution on the Si wafer, and the open squares represent the film thickness distribution on the $SiO_2$ film. It will be appreciated from FIG. 5 that the maximum film thickness on the wiring lines is about twice the minimum film thickness, and the film thickness cannot be rendered uniform.

Another problem is that moisture contained in the TEOS/$O_3$—$SiO_2$ film is diffused into the gate oxide film of an underlayer transistor and field transistor by subsequent heat treatment. The moisture acting as a positively fixed charge deteriorates a resistance to hot carriers by about an order of 10 or decreases a field breakdown voltage of the field transistor.

(2) As to Japanese Unexamined Patent Publication No. 5-41459 referring to FIG. 7 of the present application, the TEOS/O$_3$—SiO$_2$ film on an SiN film has a greater angle of tilt in a step portion, and accordingly is less flat than that on SiO$_2$, failing to meet the requirements for the microstructure of devices. The data of FIG. 7 of the present disclosure is for a wiring thickness of 0.7 um, TEOS/O$_3$—NSG film thickness of 1.3 um, silicon nitride thickness of 500 Å and a silicon oxide thickness of 1000 Å.

The SiN film as thin as 200 Å improves surface homology. However, the thin SiN film, when used on Al wiring lines, does not function as a barrier against moisture for step coverage, and thus fails to maintain stable transistor characteristics as will be apparent from FIG. 8, in which a long relative life means a small influence of moisture in the TEOS/O$_3$—SiO$_2$ film. Relative life is the ratio of hot carrier life after formation of the interlayer insulating film to hot carrier life after the first layer wiring, wherein "hot carrier life" is the time required for 10% deterioration of β of a transistor.

(3) Japanese Unexamined Patent Publication No. 63-207168

A complicated wiring structure of an LSI decreases the wiring width and inevitably increases the wiring height in order to prevent an increase in the wiring resistance, resulting in an increased step. To flatten the step, it is necessary to increase the thickness of the SOG film. However, the increase in the thickness varies with the volume of the SOG film due to solvent evaporation when heated, generating cracks at the edges of the SOG film and deteriorating the film quality. Further, there arises another problem of particle generation.

The SOG film formed by way of the spin coating process is prone to cause a problem of wettability when narrow and deep gaps are coated therewith, and accordingly has not been adapted for semiconductor devices having a microstructure.

Furthermore, gases evolved from the SOG film exposed in a contact portion causes certain compounds to be formed on the surface of the wiring layer and thus increases the viahole resistance.

SUMMARY OF THE INVENTION

The present invention provides a semiconductor substrate having a first wiring layer which is flatten by a silicon nitride film formed on a semiconductor substrate, a first silicon oxide film formed on the silicon nitride film and a second silicon oxide film formed on the first silicon oxide film by way of an atmospheric pressure CVD process using a silicon-based gas.

Further, the present invention provides a method of fabricating a semiconductor device, comprising the steps of: forming a silicon nitride film on a semiconductor substrate having a first wiring layer; forming a first silicon oxide film on the silicon nitride film; and depositing a second silicon oxide film on the first silicon oxide film by way of an atmospheric pressure CVD process using a silicon-based gas; thereby flattenning a concaved portion due to the first wiring layer.

BRIEF DESCRIPTION OF THE DRAWINGS

FIG. 8 illustrates comparative data concerning hot carrier resistance with different types of underlayers.

DESCRIPTION OF THE PREFERRED EMBODIMENTS

Figure 1A:
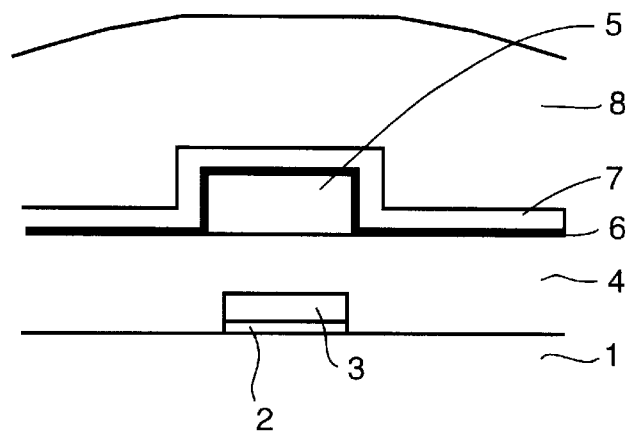
FIGS. 1(a) to 1(c) are schematic cross-sectional views illustrating the steps of fabricating a semiconductor device in accordance with the present invention.

Semiconductor substrates applicable to the present invention are not particularly limited, but a silicon substrate is preferably used. Further, the substrate may have a p-type or n-type conductivity. Impurities of the p-type conductivity include boron, and impurities of the n-type conductivity include phosphorus and arsenic. The substrate may include a source-drain region formed therein.

The substrate may include at least a first wiring layer having a concaved portion. The first wiring layer may comprise a gate electrode formed on a gate insulating film or an electrode layer formed on an interlayer insulating film.

When the first wiring layer is the gate electrode, a gate insulating film may be of a silicon oxide film having a thickness of 50 Å to 300 Å, and the gate electrode may be formed of polysilicon to a thickness of 500 Å to 3000 Å. However, the gate insulating film and the gate electrode are not limited to the above mentioned materials, but may be of well-known materials in accordance with various applications.

When the first wiring layer is the electrode layer formed on the interlayer insulating film, the electrode layer may be formed of Al or an Al alloy to a thickness of 2000 Å to 8000 Å. Examples of the Al alloy include AlCu and AlSi. Further, the electrode layer may be a laminated film consisting of a metal/alloy such as Ti, TiN, TiW or W and an Al alloy such as Al, AlCu, AlSi or AlSiCu. The interlayer insulating film may be of a silicon oxide film. A thickness of the interlayer insulating film is not limited.

A silicon nitride film and a first silicon oxide film are formed in this order on the first wiring layer to assure satisfactory flatness of a second silicon oxide film to be formed later. The thickness of the silicon nitride film is preferably 100 Å to 2000 Å in terms of reliability and stresses. The thickness of the first silicon oxide film is preferably 100 Å to 1000 Å for reduction in underlayer dependence of a second wiring layer and the second silicon oxide film to be formed later. The thickness of the first silicon oxide film which exceeds 1000 Å is not preferable in terms of coverage. The first silicon oxide film serves to prevent moisture contained in the second silicon oxide film to be described later from corroding the first wiring layer and from being diffused into the substrate.

The second silicon oxide film is formed on the first silicon oxide film. The second silicon oxide film having a thickness of 1000 Å to 20000 Å is formed by way of the atmospheric pressure CVD process using a silicon-based gas. When the TEOS/O$_3$—SiO$_2$ film is used, the second silicon oxide film may be formed up to a thickness of 2 μm to 3 μm without cracks but is preferably not more than 15000 Å in thickness in terms of throughput. The second silicon oxide film may be undoped or doped with boron or phosphorus.

The entire top surface of the second silicon oxide film is etched by way of anisotropic etching so that the second silicon oxide film has a desired thickness, and the second wiring layer having a thickness of 1000 Å to 10000 Å is then formed on the second silicon oxide film. The material of the second wiring layer is not particularly limited, but may be an Al alloy such as Al, AlSi or AlCu, or a laminated film consisting of the Al alloy and a metal/alloy such as Ti, TiN, TiW or W.

With the first and second wiring layers both made of Al, the silicon nitride film and the first silicon oxide film are preferably formed by way of the plasma CVD process, which prevents variations in thickness of the second wiring layer and reduces the angle of tilt. When the first wiring layer is not made of Al, the silicon nitride film and the first silicon oxide film are not necessarily required to be formed by way of the plasma CVD process, but may be formed, for example, by the low pressure CVD process.

A third silicon oxide film may be formed between the second silicon oxide film and the second wiring layer to prevent the second wiring layer from being subject to corrosion by moisture contained in the second silicon oxide film. The thickness of the third silicon oxide film is preferably 2000 Å to 5000 Å in terms of coverage and throughput.

Further, the total thickness of the silicon nitride film, the first silicon oxide film, the second silicon oxide film and the optionally formed third silicon oxide film is preferably 0.7 μm to 1.5 μm in terms of resistance to cracks. Excessively small total thickness may increase an interlayer capacitance to reduce device abilities.

Explanation will now be given to a method of fabricating a semiconductor device in accordance with the present invention.

Initially, a first wiring layer is formed on a semiconductor substrate. With the first wiring layer serving as a gate electrode, a gate insulating film is formed on the semiconductor substrate in a well known manner, such as thermal oxidation. Polysilicon or the like (material of the gate electrode) is deposited on the gate insulating film in a well known manner, such as CVD process, and then patterned into a desired configuration to form the gate electrode. With the first wiring layer serving as an electrode layer, the first wiring layer is formed on the semiconductor substrate and interlayer insulating film on the substrate by the way of CVD process or sputtering and is then formed into a desired configuration by way of the well known photoetching process.

A silicon nitride film is formed on the first wiring layer formed in the above described manner. The silicon nitride film may be formed by way of the plasma CVD process, low pressure CVD process or the like. With the first wiring layer made of Al, the silicon nitride film is preferably formed by way of the plasma CVD process which meets a low temperature requirement. The conditions required for the formation of the silicon nitride film by way of the plasma CVD process are an RF power of 560 W to 700 W, a pressure of 3.5 torr to 5.0 torr, a temperature of 320° C. to 400° C., a flow rate of a silicon-based gas such as SiH$_4$ in the range of 250 sccm to 320 sccm, a flow rate of a nitrogen-based gas such as NH3 in the range of 80 sccm to 120 sccm, and a flow rate of a carrier gas such as N2 of about 4000 sccm.

Then, a first silicon oxide film is formed on the silicon nitride film. The first silicon oxide film may be formed by way of the plasma CVD process or low pressure CVD process. With the first wiring layer made of Al, the first silicon oxide film is preferably formed by way of the plasma CVD process which meets a low temperature requirement. The conditions required for the formation of the first silicon oxide film by way of the plasma CVD process are an RF power of 600 W to 900 W, a pressure of 3 torr to 12 torr, a temperature of 360° C. to 400° C., a flow rate of the silicon-based gas in the range of 6 sccm to 20 sccm, and a flow rate of an oxygen-based gas such as O$_2$ in the range of 350 sccm to 950 sccm. For example, the silicon-based gas may be a gas generated by bubbling TEOS at a liquid temperature of about 50° C. with N$_2$.

A second silicon oxide film having a thickness of 5000 Å to 15000 Å is formed on the first silicon oxide film to improve the flatness. The conditions required for the formation of the second silicon oxide film are an atmospheric pressure, a temperature of 350° C. to 450° C., a flow rate of a silicon-based gas in the range of 13 sccm to 77 sccm, a flow rate of an O$_2$ gas in the range of 5 SLM to 8.5 SLM, a flow rate of an O$_3$ gas in the range of 70 sccm to 385 sccm, and a flow rate of an N$_2$ gas in the range of 9 SLM to 27 SLM. The silicon-based gas may be generated by an organic silicon compound such as TEOS, a siloxane (e.g., hexamethyldisiloxane) or a disilazane (e.g., hexamethyldisilazane) and ozone (O$_3$). The silicon-based gas may be a gas generated, for example, by bubbling the organic silicon compound at a liquid temperature of about 50° C. with N$_2$. Where the second silicon oxide film is doped with boron (which is a p-type impurity) or phosphorus (which is an n-type impurity), trimethyl borate (TMB) or the like for boron doping or trimethyl phosphate (TMP), a triethyl phosphate (TEP) or the like for phosphorus doping may be introduced to the second silicon oxide film at a flow rate of 10 sccm to 100 sccm.

The second silicon oxide film is etched to a predetermined thickness by way of the etchback process as required. An exemplary etchback process includes reactive ion etching. With the wiring layer having a height of 3000 Å to 10000 Å, the second silicon oxide film may be 2000 Å to 15000 Å thick and a third silicon oxide film to be subsequently formed may be 100 Å to 1000 Å thick for omission of the etchback process.

An anealing process for 10 min to 120 min at a temperature of 350° C. to 450° C. in an atmosphere of nitrogen is preferably performed in this stage to remove absorbed moisture.

The third silicon oxide film is then formed on the second silicon oxide film as required. The forming process of the third silicon oxide film is the same with the forming process of the first silicon oxide film.

A connecting hole is formed in the silicon nitride film, the first silicon oxide film, the second silicon oxide film, and the optionally formed third oxide film for connection between the first wiring layer and a second wiring layer to be formed later. The connecting hole is preferably formed by first performing wet etching and then dry etching to widen the opening thereof.

In turn, the second wiring layer is formed by way of the CVD process or sputtering and is patterned into a desired configuration by way of the well known photoetching process. Thus, a semiconductor device is fabricated.

The semiconductor device of the present invention achieves improvements to be described below by forming the silicon nitride film, the first silicon oxide film and the second silicon oxide film on the first wiring layer as above described.

First, the silicon nitride film prevents moisture contained in the second silicon oxide film or moisture to be absorbed in the later process sequence from being diffused into the layers below the silicon nitride film.

Figure 3:
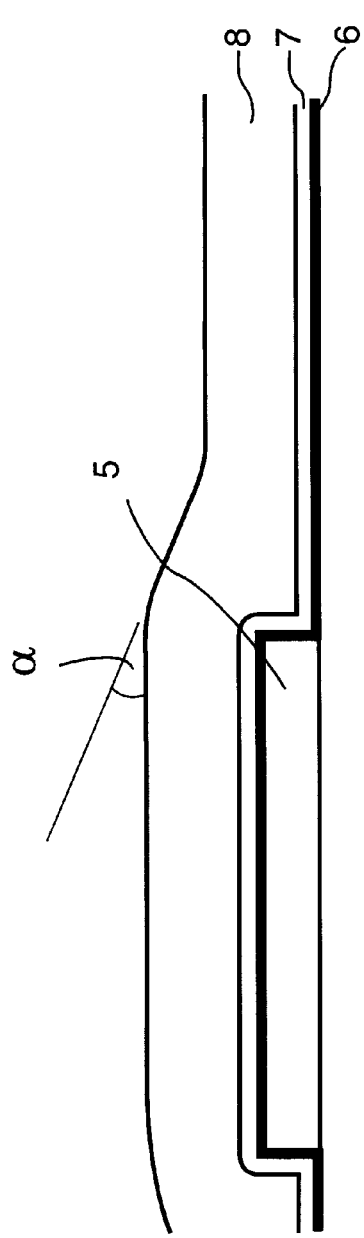
FIG. 3 is a schematic cross-sectional view illustrating step coverage of a second silicon oxide film in accordance with the present invention.
Figure 4:
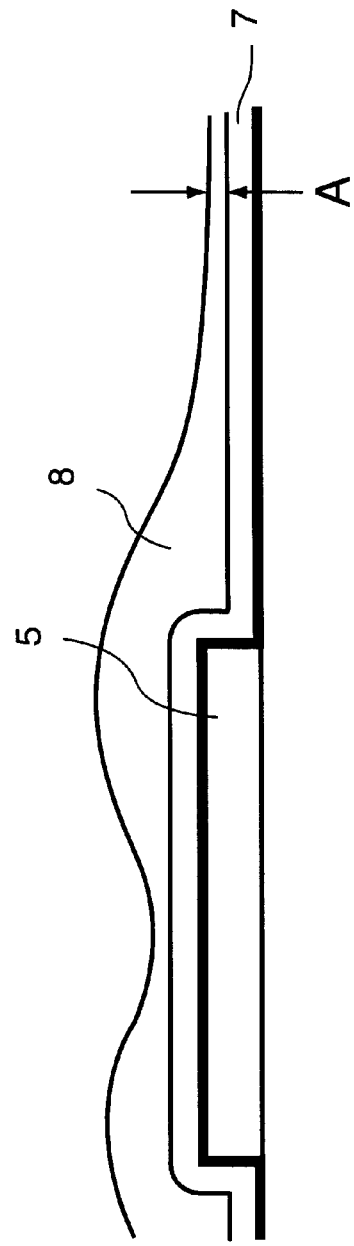
FIG. 4 is a schematic cross-sectional view illustrating step coverage of a second silicon oxide film of the prior art.

The second silicon oxide film formed on the first silicon oxide film has a better tilt angle, i.e., better flatness than that formed directly on the silicon nitride film as shown in FIG. 3. The angle of tilt is illustrated as α.

Figure 2A:
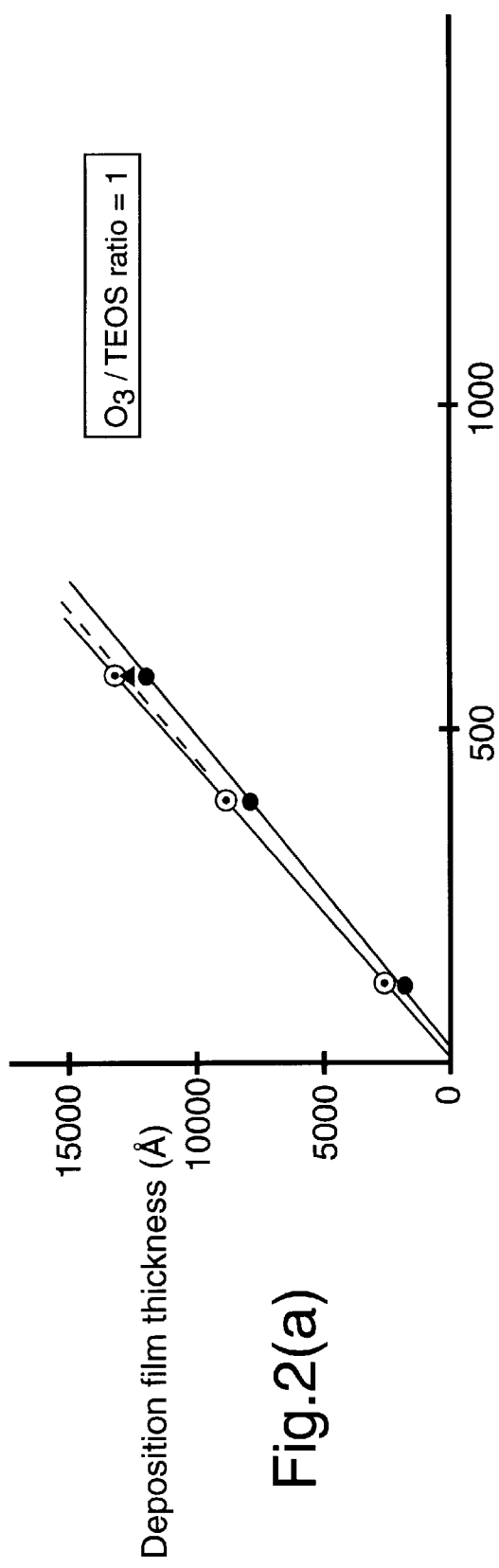
FIGS. 2(a) and 2(b) are graphical representations illustrating the underlayer-dependence of the film formation rate of a TEOS/O$_3$—SiO$_2$ film.
Figure 2B:
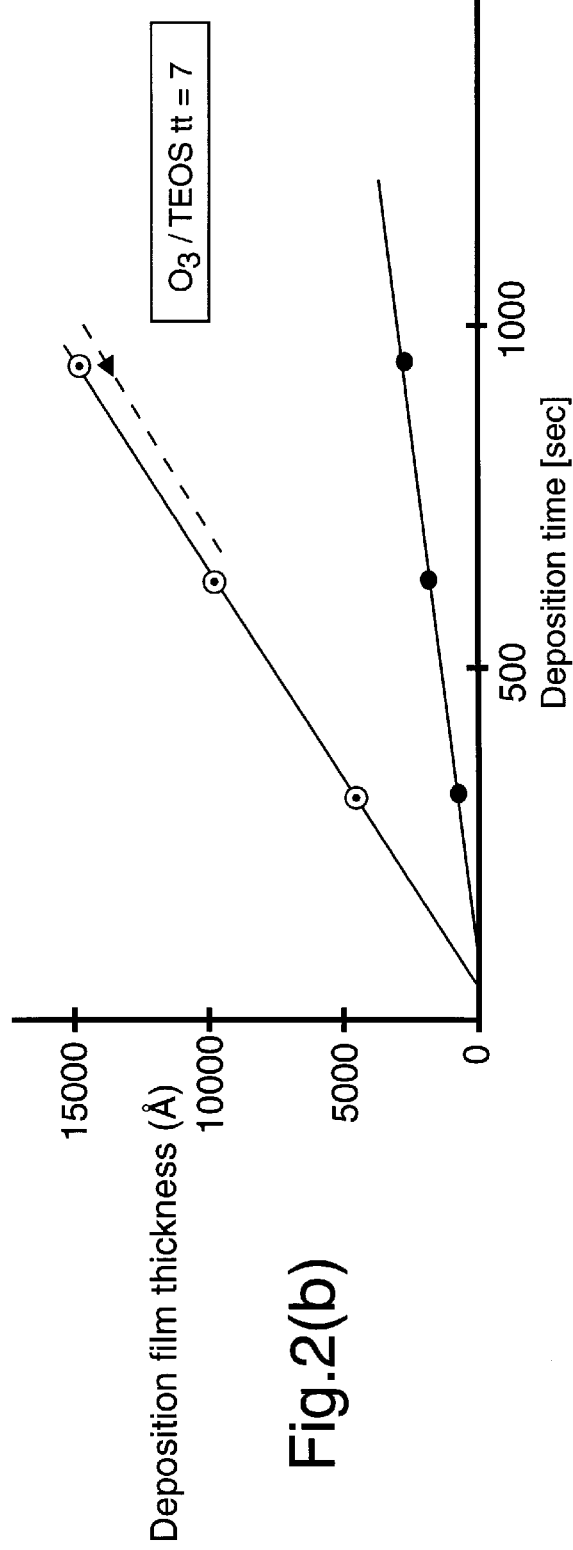
Figure 5A:
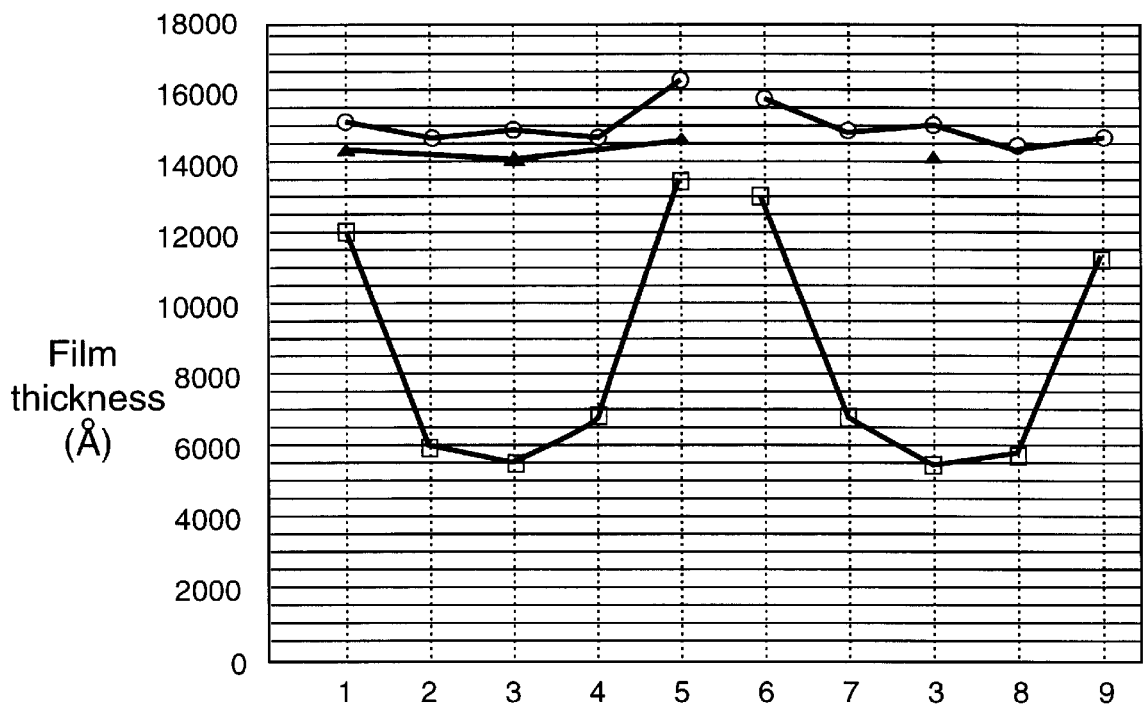
FIGS. 5, 5(a) is a graphical representation illustrating inplane uniformity of the TEOS/O$_3$—SiO$_2$ film.
Figure 5B:
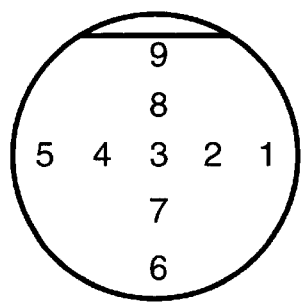
Figure 6A:
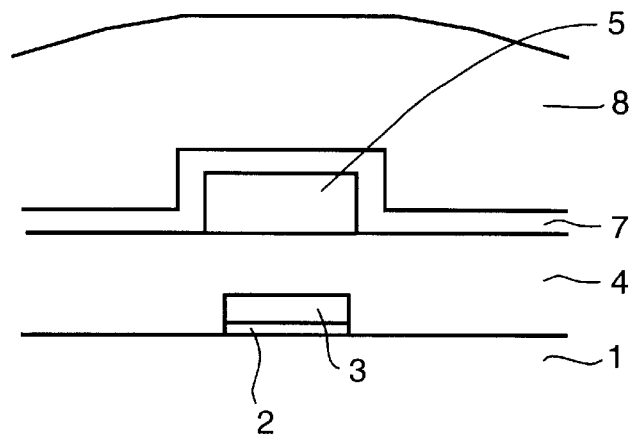
FIGS. 6(a) to 6(c) are schematic cross-sectional views illustrating the steps of fabricating a semiconductor device of the prior art.
Figure 6B:
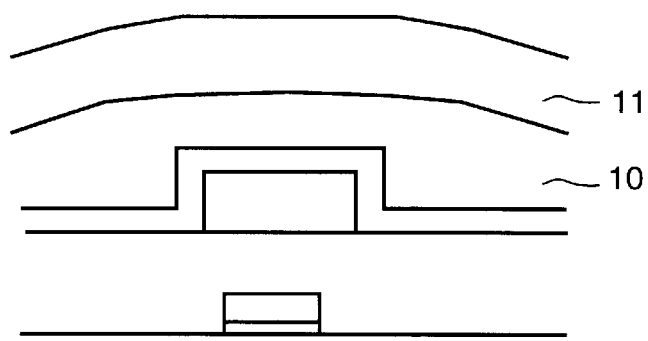
Figure 6C:
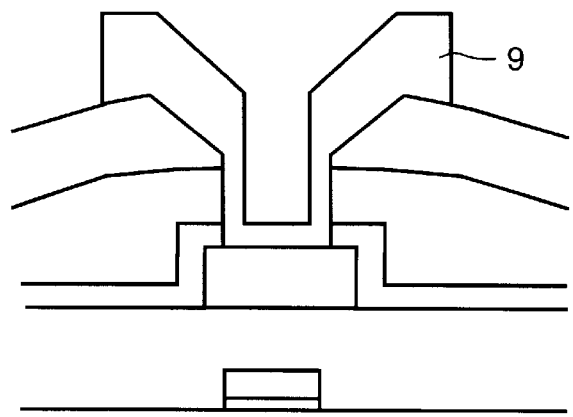
Figures 7A, 7B:
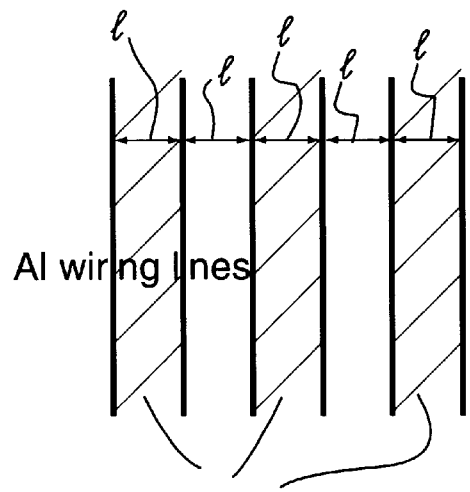
FIG. 7 illustrates comparative data concerning step coverage with different types of underlayers.

Further, it is apparent from FIGS. 2(a) and 2(b) that the two-layer structure consisting of the silicon nitride film and the first silicon oxide film permits the deposition rate (indicated by the solid triangle) of the TEOS/$O_3$—$SiO_2$ film (the second silicon oxide film) on the first silicon oxide film to approach the deposition rate (indicated by the open circle) thereof on the Si wafer to eliminate the underlayer dependence of the TEOS/$O_3$—$SiO_2$ film deposition, independently of $O_3$/TEOS flow ratio. Thus, the second silicon oxide film can be formed under a condition of a high $O_3$/TEOS flow ratio required for excellent film quality thereof. It is apparent from FIG. 5 that the thickness (indicated by the solid triangle) of the second silicon oxide film is generally equal to the thickness (indicated by the open circle) thereof on the Si wafer at different points within the wafer surface, reducing thickness variations within the wafer surface. Furthermore, since the deposition of the second silicon oxide film is not influenced by the underlayer, regardless of the flow ratio variation, the second silicon oxide film can be deposited stably and uniformly on a wide wiring pattern.

EXAMPLES

Figure 9A:
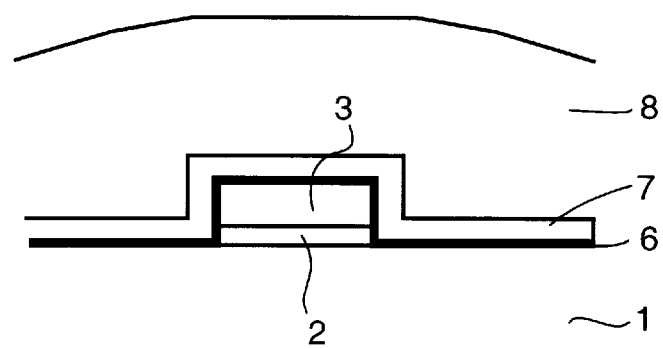
FIGS. 9(a) to 9(c) are schematic cross-sectional views illustrating the steps of fabricating a semiconductor device in accordance with an embodiment of the present invention.
Figure 9B:
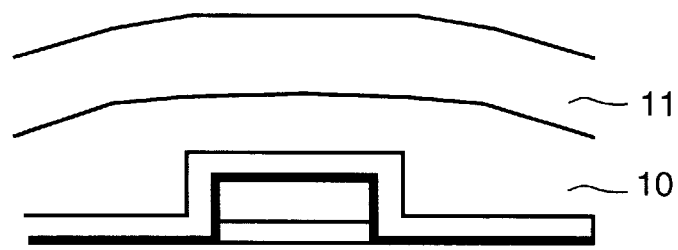
Figure 9C:
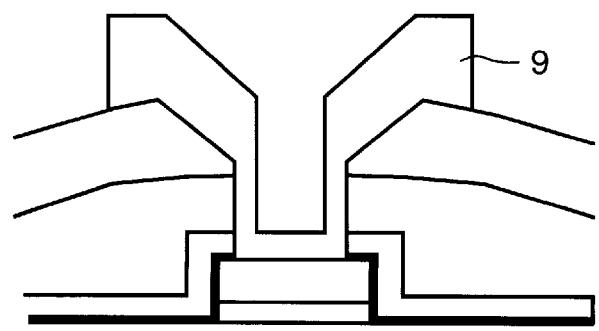

The present invention will be described in further detail by way of examples illustrated in FIGS. 1(a) to 1(c) but is not limited by the examples. An alternative embodiment is illustrated in FIGS. 9(a) to 9(c) in which like reference numerals refer to like elements.

Example 1

An MOS transistor including a gate oxide film 2 and a gate electrode 3 was fabricated on a p-type silicon substrate 1. Then, an interlayer insulating film 4 was formed over the silicon substrate 1 and the gate electrode 3.

Ti, TiN, Al—Cu and Ti were deposited on the interlayer insulating film 4 in this order by way of the sputtering process to thicknesses of 500 Å, 1000 Å, 4000 Å and 1000 Å, respectively, to form a laminated film. Then, a first wiring layer 5 (electrode layer) was formed in a desired position by way of the conventional photoetching process. A silicon nitride film 6 having a thickness of 1000 Å was formed by way of the plasma CVD process so as to cover the first wiring layer 5 and the interlayer insulating film 4. The conditions for the formation of the silicon nitride film 6 were an RF power of 640 W, a pressure of 4 torr, an $SiH_4$ gas flow rate of 280 sccm (a gas flow rate means a flow rate per minute hereinafter), an $NH_3$ gas flow rate of 100 sccm, an $N_2$ gas flow rate of 4000 sccm, and a temperature of 360° C.

A first silicon oxide film 7 having a thickness of 1000 Å was formed on the silicon nitride film 6 by way of the plasma CVD process. The conditions for the formation of the first silicon oxide film 7 were an RF power of 630 W, a pressure of 8 torr, an $N_2$ bubbling gas flow rate of 850 sccm at which TEOS was bubbled with $N_2$ gas (at a liquid temperature of 50° C.), an $O_2$ gas flow rate of 600 sccm, and a temperature of 390° C.

A TEOS/$O_3$—$SiO_2$ film 8 having a thickness of 15000 Å was formed on the first silicon oxide film 7 by way of the atmospheric pressure CVD process to increase the flatness. The conditions for the formation of the TEOS/$O_3$—$SiO_2$ film 8 were an atmospheric pressure, an $O_3$ gas flow rate of 385 sccm, an $N_2$ bubbling gas flow rate of 2 liters per minute at which TEOS was bubbled with $N_2$ gas (at a liquid temperature of 65° C.), an $N_2$ gas flow rate of 18 liters per minute, an $O_2$ gas flow rate of 7.5 liters per minute, and a temperature of 400° C. (see FIG. 1(a)).

To form a second silicon oxide film 10 of a predetermined thickness, the TEOS/$O_3$—$SiO_2$ film 8 was etched back by way of the reactive ion etching to remove part of the TEOS/$O_3$—$SiO_2$ film 8 by a thickness of about 10000 Å. The etchback conditions were an RF power of 1000 W, and a pressure of 250 mtorr. The etchants were $CF_4$ gas (110 sccm) and Ar gas (55 sccm).

To remove moisture absorbed by the second silicon oxide film 10, the annealing process was performed for 30 minutes at 420° C. in an atmosphere of nitrogen.

Figure 1B:
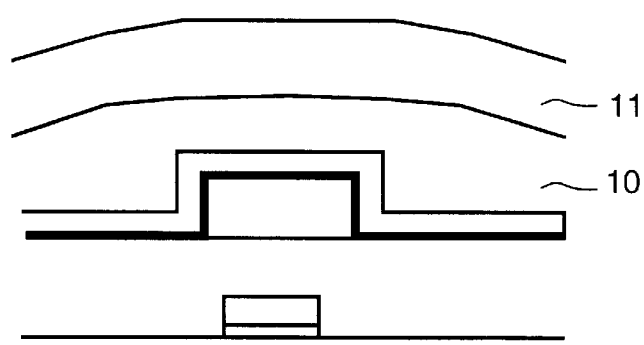

A third silicon oxide film 11 having a thickness of 5000 Å was formed on the second silicon oxide film 10 under the same conditions as the first silicon oxide film 7 (see FIG. 1(b)).

A connecting hole was formed by way of the photoresist process in the silicon nitride film 4, the first silicon oxide film 5, the second silicon oxide film 10 and the third silicon oxide film 11 on the first wiring layer 5. The etching was performed such that dry etching followed wet etching to widen the opening of the connecting hole.

Figure 1C:
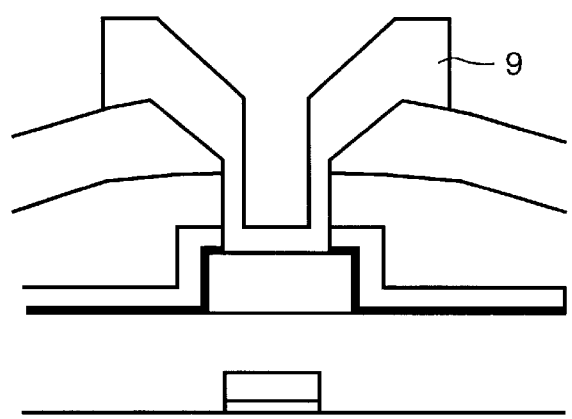

Then, TiN and an Al alloy were deposited to be formed into a second wiring layer 9 by way of the conventional photoresist process for connection between the first and second wiring layers (see FIG. 1(c)).

According to the present invention, as stated above, the second silicon oxide film can be formed by way of the atmospheric pressure CVD process employing tetraethyl orthosilicate, siloxane or disilazane and $O_3$ as source materials in a low to high ozone concentration range without the underlayer dependence of film deposition. This allows the formation of the interlayer insulating film to provide an increased process margin, thereby improving the yield of semiconductor devices.

The second silicon oxide film can be formed flatly and uniformly without the underlayer dependence over the wafer surface, permitting semiconductor devices having microstructure to be produced with a high yield.

The second silicon oxide film can be deposited over the wafer surface at a deposition rate as high as that for the film deposition on silicon, achieving improved throughput in the fabrication process.

The provision of the silicon nitride film under the second silicon oxide film reduces the influence upon a transistor formed on the semiconductor substrate, providing a highly reliable semiconductor device. The thicker the SiN film, the longer the hot carrier life (time required for 10% deterioration of β of a transistor) influenced by moisture.

Because of the effects described above, the present invention provides a highly reliable semiconductor device having a more minuscule construction.

What is claimed is:

1. A semiconductor device having a microstructure comprising:

a semiconductor substrate having a first wiring layer which is flattened by a silicon nitride film formed on the semiconductor substrate, said first wiring layer serving as a gate electrode;

a first silicon oxide film having a thickness of 100 Å to 1000 Å formed on the silicon nitride film; and a second silicon oxide film formed on the first silicon oxide film by an atmospheric pressure CVD process using a silicon-based gas, wherein said silicon nitride film and said first silicon oxide film are formed by way of a low pressure CVD process or a plasma CVD process.

2. A semiconductor device as set forth in claim 1, wherein said silicon-based gas is tetraethyl orthosilicate, siloxane or disilazane and ozone.

3. A semiconductor device as set forth in claim 1, wherein said second silicon oxide film has a thickness of 1000 Å to 20000 Å.

4. A semiconductor device as set forth in claim 1, wherein said first wiring layer comprises polysilicon and said substrate comprises silicon.

5. A semiconductor device as set forth in claim 1, further comprising:

a second wiring layer formed on said second silicon oxide film and made of aluminum or an aluminum alloy.

6. A semiconductor device as set forth in claim 1, wherein said silicon nitride film has a thickness of 100 Å to 2000 Å.

7. A semiconductor device as set forth in claim 1, further comprising:

a third silicon oxide film formed on said second silicon oxide film by way of a plasma CVD process or a low pressure CVD process.

8. A semiconductor device as set forth in claim 7, wherein said third silicon oxide film has a thickness of 2000 Å to 5000 Å.

9. A semiconductor device as set forth in claim 7, wherein the total thickness of said silicon nitride film, said first silicon oxide film, said second silicon oxide film, and said third silicon oxide film to be optionally formed is 0.7 $\mu$m to 1.5 $\mu$m.

* * * * *